(12) United States Patent
Matsushita

(10) Patent No.: US 9,299,695 B2
(45) Date of Patent: Mar. 29, 2016

(54) SEMICONDUCTOR DEVICE

(71) Applicant: KABUSHIKI KAISHA TOSHIBA, Tokyo (JP)

(72) Inventor: Kenichi Matsushita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/072,585

(22) Filed: Nov. 5, 2013

(65) Prior Publication Data

US 2014/0061720 A1 Mar. 6, 2014

Related U.S. Application Data

(62) Division of application No. 13/049,540, filed on Mar. 16, 2011, now Pat. No. 8,604,544.

(30) Foreign Application Priority Data

Mar. 24, 2010 (JP) .................................. 2010-068986

(51) Int. Cl.
| | |
|---|---|
| *H01L 29/66* | (2006.01) |
| *H01L 21/70* | (2006.01) |
| *H01L 27/06* | (2006.01) |
| *H01L 29/10* | (2006.01) |
| *H01L 29/739* | (2006.01) |

(52) U.S. Cl.
CPC ........ *H01L 27/0623* (2013.01); *H01L 29/1095* (2013.01); *H01L 29/7397* (2013.01)

(58) Field of Classification Search
USPC ................................. 257/140, 238, 335, 341
See application file for complete search history.

(56) References Cited

U.S. PATENT DOCUMENTS

| | | | |
|---|---|---|---|
| 6,586,800 B2 | 7/2003 | Brown | |
| 2004/0150036 A1* | 8/2004 | Kawaguchi | ......... H01L 29/7813 257/328 |

(Continued)

FOREIGN PATENT DOCUMENTS

| | | |
|---|---|---|
| JP | 2002-016252 A | 1/2002 |
| JP | 2002-540603 A | 11/2002 |

(Continued)

OTHER PUBLICATIONS

Japanese Office Action dated Jul. 19, 2012, filed in Japanese counterpart Application No. 2010-068986, 7 pages (with English translation).

(Continued)

*Primary Examiner* — Marc Armand
*Assistant Examiner* — Wilner Jean Baptiste
(74) *Attorney, Agent, or Firm* — Patterson & Sheridan, LLP

(57) ABSTRACT

According to one embodiment, a semiconductor device includes a first main electrode, a base layer of a first conductivity type, a barrier layer of the first conductivity type, a diffusion layer of a second conductivity type, a base layer of the second conductivity type, a first conductor layer, a second conductor layer, and a second main electrode. Bottoms of the barrier layer of the first conductivity type and the diffusion layer of the second conductivity type are positioned on the first main electrode side of lower ends of the first conductor layer and the second conductor layer. The barrier layer of the first conductivity type and the diffusion layer of the second conductivity type form a super junction proximally to tips of the first conductor layer and the second conductor layer.

11 Claims, 10 Drawing Sheets

(56) References Cited

U.S. PATENT DOCUMENTS

| | | |
|---|---|---|
| 2006/0237793 A1 | 10/2006 | Nadd et al. |
| 2007/0114570 A1 | 5/2007 | Yamaguchi et al. |
| 2007/0278566 A1* | 12/2007 | Ogura et al. .......... 257/330 |

FOREIGN PATENT DOCUMENTS

| | | |
|---|---|---|
| JP | 2003-078139 A | 3/2003 |
| JP | 2004-153112 A | 5/2004 |
| JP | 2004-241413 A | 8/2004 |
| JP | 2005-032941 A | 2/2005 |
| JP | 2005-340626 A | 12/2005 |
| JP | 2007-317683 A | 12/2007 |
| JP | 2008-227251 A | 9/2008 |
| JP | 2009-043966 A | 2/2009 |
| JP | 2009-277939 A | 11/2009 |
| JP | 2010232627 A | 10/2010 |

OTHER PUBLICATIONS

Japanese Office Action dated Nov. 13, 2012 filed in Japanese counterpart Application No. 2010-068986, 3 pages (including English translation).

Japanese Office Action dated Mar. 7, 2014, filed in Japanese counterpart Application No. 2013-039949, 4 pages (with translation).

Japanese Office Action dated Feb. 13, 2015, filed in Japanese counterpart Application No. 2013-039949, 4 pages (with translation).

* cited by examiner

SEMICONDUCTOR DEVICE

CROSS-REFERENCE TO RELATED APPLICATIONS

This application is a divisional application of U.S. patent application Ser. No. 13/049,540, filed Mar. 16, 2011, which is based upon and claims the benefit of priority from the prior Japanese Patent Application No. 2010-068986, filed on Mar. 24, 2010; the entire contents of which are incorporated herein by reference.

FIELD

Embodiments described herein relate generally to a semiconductor device.

BACKGROUND

An IGBT (Insulated Gate Bipolar Transistor) is one example of a power semiconductor device. In an IGBT, a p-type collector layer and an n-type base layer are stacked in this order on a collector electrode; and multiple trench gate electrodes are provided thereon with stripe configurations. Then, a p-type base layer is provided in the region between the trench gate electrodes; and an n-type emitter layer connected to an emitter electrode is provided in a portion of the upper layer portion of the p-type base layer.

In the IGBT, a MOS channel is formed in the p-type base layer by a positive potential being applied to the trench gate electrode; electrons are introduced from the n-type emitter layer while holes are introduced from the p-type collector layer; and a current flows between the collector electrode and the emitter electrode.

Recently, a method has been discussed to suppress the emission of accumulated carriers (e.g., holes) proximal to the element surface to reduce the saturation voltage (Vce (sat)) between the collector electrode and the emitter electrode in the on-state. In such an example, an n-type barrier layer is provided directly under the p-type base layer to suppress the emission of the accumulated carriers proximal to the element surface.

However, the concentration of the n-type barrier layer cannot be increased because it is necessary to suppress breakdown between the n-type barrier layer and the p-type base layer. Thereby, a limitation occurs on the saturation voltage (Vce (sat)); and the characteristics of the semiconductor device unfortunately cannot be improved.

DETAILED DESCRIPTION

In general, according to one embodiment, a semiconductor device includes a first main electrode, a base layer of a first conductivity type, a barrier layer of the first conductivity type, a diffusion layer of a second conductivity type, a base layer of the second conductivity type, a first conductor layer, a second conductor layer, and a second main electrode. The base layer of the first conductivity type is provided on the first main electrode. The barrier layer of the first conductivity type and the diffusion layer of the second conductivity type are provided on the base layer of the first conductivity type. The barrier layer of the first conductivity type and the diffusion layer of the second conductivity type are arranged alternately. The base layer of the second conductivity type is provided on the barrier layer of the first conductivity type. The first conductor layer and the second conductor layer are provided between the base layer of the second conductivity type and the diffusion layer of the second conductivity type and between the barrier layer of the first conductivity type and the diffusion layer of the second conductivity type. The first conductor layer and the second conductor layer are provided with trench configurations with an interposed insulating film. The second main electrode is connected to the base layer of the second conductivity type. Bottom faces of the barrier layer of the first conductivity type and the diffusion layer of the second conductivity type are positioned on the first main electrode side of lower ends of the first conductor layer and the second conductor layer. The barrier layer of the first conductivity type and the diffusion layer of the second conductivity type form a super junction proximally to tips of the first conductor layer and the second conductor layer.

Embodiments of the invention will now be described with reference to the drawings.

First Embodiment

Figure 1:
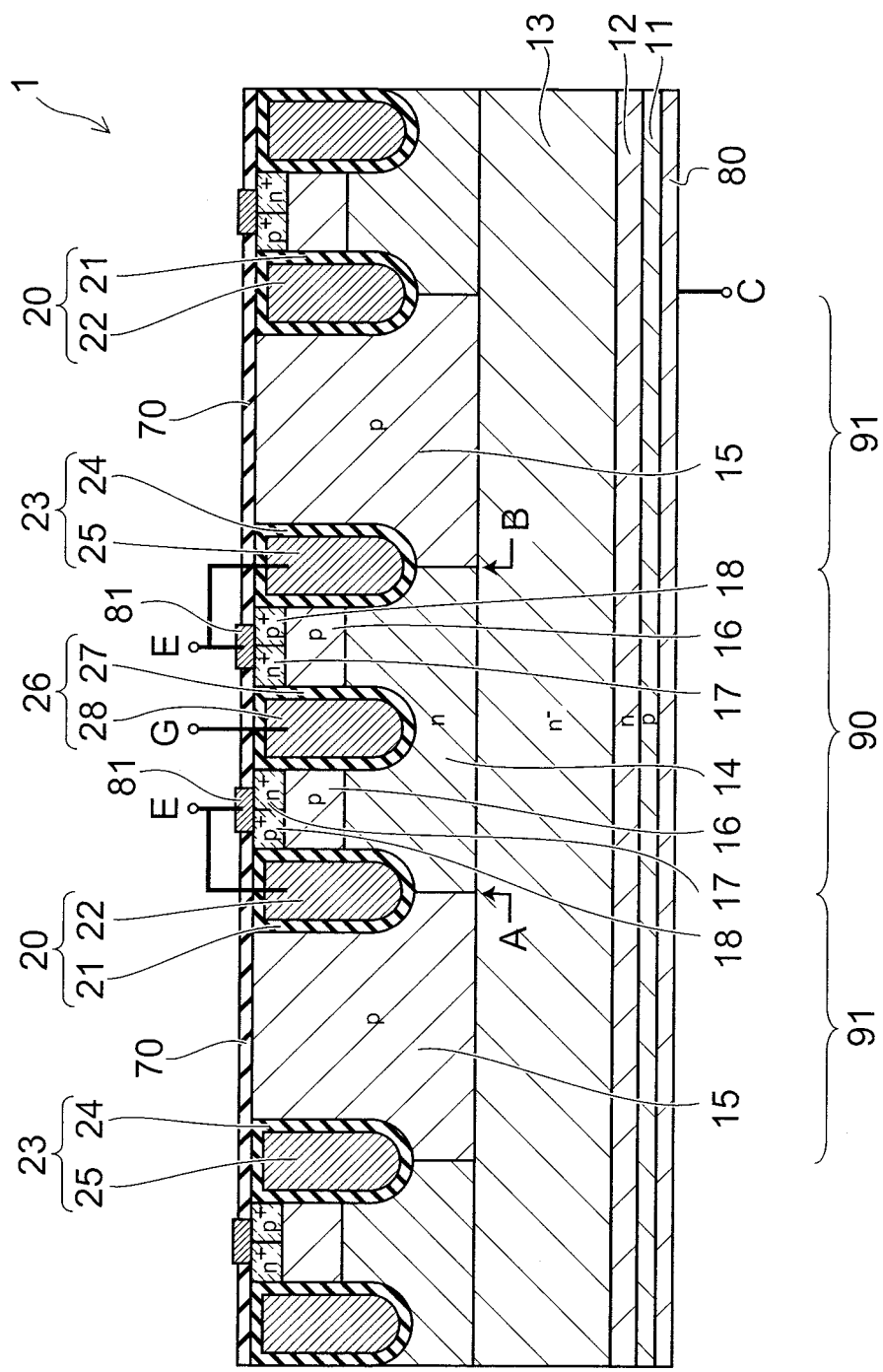
FIG. 1 is a schematic cross-sectional view of main components of a semiconductor device according to a first embodiment.

FIG. 1 is a schematic cross-sectional view of main components of a semiconductor device according to a first embodiment.

Figure 2:
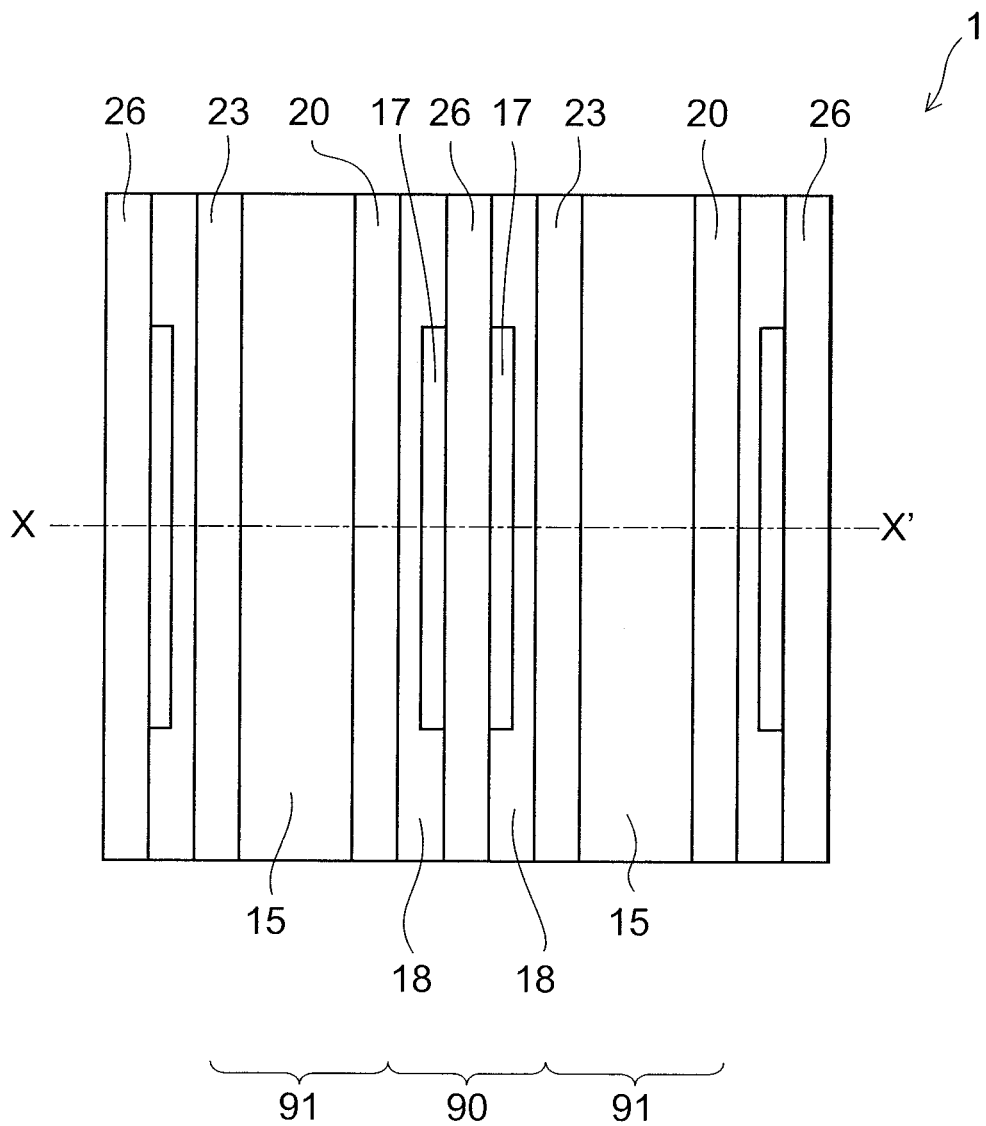
FIG. 2 is a schematic plan view of the main components of the semiconductor device according to the first embodiment.

FIG. 2 is a schematic plan view of the main components of the semiconductor device according to the first embodiment.

FIG. 1 illustrates a cross section along X-X' of FIG. 2. An emitter electrode 81 and an insulating layer 70 illustrated in FIG. 1 are not illustrated in FIG. 2.

The semiconductor device 1 illustrated in FIG. 1 and FIG. 2 is a power semiconductor device (e.g., an IEGT (Injection Enhanced Gate Transistor)) and includes a collector electrode 80 which is a first main electrode, a p-type collector layer 11, an n⁻-type base layer 13, an n-type barrier layer 14, a p-type diffusion layer 15, a p-type base layer 16, an n+-type emitter layer 17, trenches 20, 23, and 26, and the emitter electrode 81 which is a second main electrode. Herein, "collectors" may be referred to as "drains;" and "emitters" may be referred to as "sources." The n-type impurity conductivity type is taken as a first conductivity type; and the p-type is taken as a second conductivity type.

In the semiconductor device 1 as illustrated in FIG. 1, the p-type collector layer 11 is provided on the collector electrode 80 (the first main electrode). An n-type buffer layer 12 is provided on the p-type collector layer 11. The n−-type base layer 13 is provided on the n-type buffer layer 12. The impurity concentration of the n−-type base layer 13 is lower than the impurity concentration of the n-type buffer layer 12. The n−-type base layer 13 functions as a drift layer.

The n-type barrier layer 14 and the p-type diffusion layer 15 are provided on the n−-type base layer 13. The n-type barrier layer 14 and the p-type diffusion layer 15 are alternately arranged on the n−-type base layer 13. The impurity concentration of the n-type barrier layer 14 is higher than the impurity concentration of the n−-type base layer 13. The upper face of the n-type barrier layer 14 is lower than the upper face of the p-type diffusion layer 15. Restated, the n-type barrier layer 14 is formed with a protruding configuration from the major surface of the n−-type base layer 13 toward the p-type diffusion layer 15 side. The p-type base layer 16 is provided on the n-type barrier layer 14. The n+-type emitter layer 17 and a p+-type contact layer 18 are provided selectively in the surface of the p-type base layer 16. Multiple trenches are made with trench configurations from the surfaces of the p-type base layer 16 and the p-type diffusion layer 15 toward the collector electrode 80 side. The trenches are provided between the p-type base layer 16 and the p-type diffusion layer 15 and between the n-type barrier layer 14 and the p-type diffusion layer 15.

For example, the n-type barrier layer 14 is interposed in the p-type diffusion layer 15. Thereby, two pn junction interfaces exist on two sides of the n-type barrier layer 14. One of the two pn junction interfaces is indicated by arrow A in the drawings; and the pn junction interface on the side opposite to arrow A is indicated by arrow B.

The trench 20 is made with a trench configuration from the surfaces of the p-type base layer 16 and the n+-type emitter layer 17 toward the collector electrode 80 side at the junction interface between the n-type barrier layer 14 and the p-type diffusion layer 15 indicated by arrow A. A conductor layer 22 made of, for example, polysilicon is provided inside the trench 20 with an insulating film 21 such as an oxide film interposed. The bottom faces (the lower faces) of the p-type diffusion layer 15 and the n-type barrier layer 14 are positioned on the collector electrode 80 side of the lower end of the trench 20. The n-type barrier layer 14 and the p-type diffusion layer 15 form a super junction proximally to the tip (proximally to the lower end) of the trench 20.

The trench 23 is made with a trench configuration from the surfaces of the p-type base layer 16 and the n+-type emitter layer 17 toward the collector electrode 80 side at the junction interface between the n-type barrier layer 14 and the p-type diffusion layer 15 indicated by arrow B. A conductor layer 25 made of, for example, polysilicon is provided inside the trench 23 with an insulating film 24 such as an oxide film interposed. The bottom faces of the p-type diffusion layer 15 and the n-type barrier layer 14 are positioned on the collector electrode 80 side of the lower end of the trench 23. The n-type barrier layer 14 and the p-type diffusion layer 15 form a super junction proximally to the tip of the trench 23.

In the semiconductor device 1, the trench 26 is provided with a trench configuration between the trench 20 and the trench 23. The trench 26 pierces the n+-type emitter layer 17 and the p-type base layer 16 to reach the n-type barrier layer 14. A conductor layer 28 made of, for example, polysilicon is provided inside the trench 26 with an insulating film 27 such as an oxide film interposed. The trench 20, the trench 23, and the trench 26 have substantially the same depth.

Thus, in the semiconductor device 1, the bottom faces of the p-type diffusion layer 15 and the n-type barrier layer 14 are positioned on the collector electrode 80 side of the lower ends of the trenches 20, 23, and 26. The conductor layer 28 is a trench gate electrode (a control electrode) of the semiconductor device 1 and is electrically connected to a gate interconnect (not illustrated). The conductor layer 28 is a control electrode configured to control the current flow between the n+-type emitter layer 17 and the n-type barrier layer 14.

The p+-type contact layer 18 and the n+-type emitter layer 17 are electrically connected to the emitter electrode 81 (the second main electrode). The conductor layer 22 inside the trench 20 and the conductor layer 25 inside the trench 23 are electrically connected to the emitter electrode 81. Thereby, the potential of the conductor layer 28 which is the trench gate electrode is shielded by the conductor layer 22 and the conductor layer 25 provided on the two sides of the conductor layer 28. In other words, the conductor layer 22 and the conductor layer 25 function as electrical shield layers of the conductor layer 28. The insulating layer 70 is provided on the surfaces of the p-type diffusion layer 15, the p-type base layer 16, the n+-type emitter layer 17, and the trenches 20, 23, and 26.

In the semiconductor device 1 as illustrated in FIG. 2, each of the trenches 20, 23, and 26 extend in substantially parallel stripe configurations. The extension direction is, for example, a direction substantially parallel to the major surface of the n−-type base layer 13. The p+-type contact layer 18 is provided adjacent to the n+-type emitter layer 17.

Referring to FIG. 1 and FIG. 2, the n+-type emitter layer 17 is positioned on two sides of the trench 26 and contacts the side faces of the trench 26. The p-type base layer 16 contacts the side face of the trench 20 or the side face of the trench 23. The p-type base layer 16 is provided under the n+-type emitter layer 17 and the p+-type contact layer 18. The p-type base layer 16 is electrically connected to the emitter electrode 81 via the n+-type emitter layer 17 or the p+-type contact layer 18.

The width of the n-type barrier layer 14 interposed in the p-type diffusion layer 15 is narrower than the width of the p-type diffusion layer 15, where the "width" of the members in the semiconductor device 1 is defined as the width in a direction which is substantially perpendicular to the direction in which the trenches 20, 23, and 26 extend in stripe configurations and is substantially parallel to the major surface of the n−-type base layer 13.

For example, the width of a main cell 90 is narrower than the width of a sub-cell 91, where the main cell 90 is taken to be the region occupied by the n-type barrier layer 14 and the p-type base layer 16 on the collector electrode 80 and the sub-cell 91 is taken to be the region occupied by the p-type diffusion layer 15 on the collector electrode 80. For example, the width of the sub-cell 91 is adjusted to be about 2 to 5 times the width of the main cell 90.

The main cell 90 and the sub-cell 91 extend in the direction in which the trenches 20, 23, and 26 extend and are disposed alternately. The main cell 90 includes the conductor layer 28 which is the gate electrode, the p-type base layer 16, the n+-type emitter layer 17, and the n-type barrier layer 14 to function as a MOSFET (Metal Oxide Semiconductor Field Effect Transistor). Therefore, the impurity concentrations and the surface areas of the p-type base layer 16 and the n$^+$-type emitter layer 17 of the main cell 90 are determined according to the necessary performance of the MOSFET. On the other hand, the impurity concentration of the n-type barrier layer 14 may be a concentration higher than the impurity concentration of the n$^-$-type base layer 13. However, the impurity concentration is adjusted such that the depletion layer enlarges sufficiently from the pn junction interface between the n-type barrier layer 14 and the p-type diffusion layer 15.

The materials of the p-type collector layer 11, the n-type buffer layer 12, the n$^-$-type base layer 13, the n-type barrier layer 14, the p-type diffusion layer 15, the p-type base layer 16, the n$^+$-type emitter layer 17, and the p$^+$-type contact layer 18 have, for example, silicon (Si) as the main component. The materials of the collector electrode 80 and the emitter electrode 81 are metals. The materials of the insulating films 21, 24, and 27 are, for example, silicon oxide ($SiO_2$).

Operational effects of the semiconductor device 1 will now be described.

Figure 3:
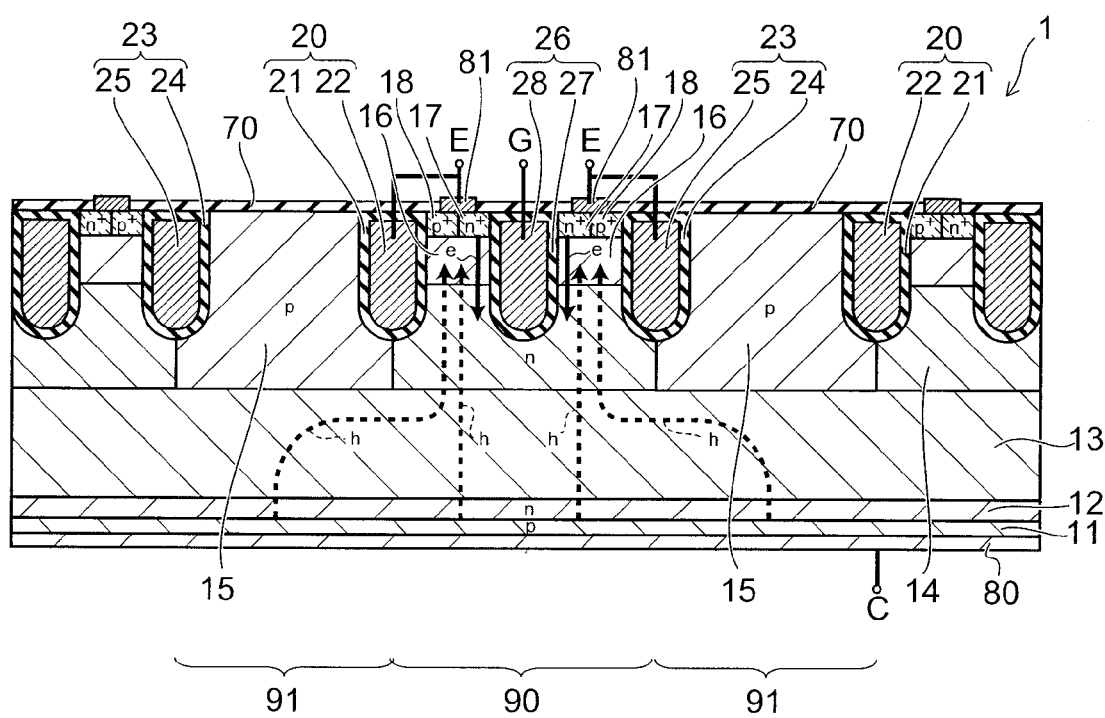
FIG. 3 illustrates operational effects of the semiconductor device 1.

FIG. 3 illustrates the operational effects of the semiconductor device 1.

A potential not less than the threshold value is applied to the conductor layer 28 of the semiconductor device 1 illustrated in FIG. 3 in a state in which the potential of the emitter electrode 81 is, for example, a grounding potential and a potential higher than the grounding potential is applied to the collector electrode 80. Then, a channel is formed in the region of the p-type base layer 16 contacting the insulating film 27. Thereby, the MOSFET formed in the main cell 90 is switched to the on-state; and electrons flow from the n$^+$-type emitter layer 17 via the channel into the n-type barrier layer 14 (referring to arrow e (the electrons) in the drawing). At this time, holes flow from the p-type collector layer 11 via the n-type buffer layer 12 into the n$^-$-type base layer 13 (referring to arrow h (the holes)). As a result, a current flows between the collector electrode 80 and the emitter electrode 81.

At this time, the emitter electrode 81 is connected to only the main cell 90 and is not connected to the sub-cell 91. The holes inside the n$^-$-type base layer 13 are emitted outside the semiconductor device 1 only via the main cell 90 through the p$^+$-type contact layer 18 described above. Other than the main cell 90 of the semiconductor device 1, a barrier to the holes is formed because the sub-cell 91 that does not contribute to the current flow is provided. Further, the n-type barrier layer 14 is disposed under the p-type base layer 16 in the semiconductor device 1. Thereby, the amount of the holes flowing into the p-type base layer 16 is reduced. This effect becomes pronounced as the width of the main cell 90 decreases or the concentration of the n-type barrier layer 14 increases. As a result, the amount of the electrons injected via the n$^+$-type emitter layer 17 relatively increases; and the carrier concentrations of the n-type barrier layer 14 and the n$^-$-type base layer 13 under the p-type base layer 16 relatively increase.

In the main cell 90 of the semiconductor device 1, the path of the electrons flowing through the n-type semiconductor layer increases because the n-type barrier layer 14, which has an impurity concentration higher than that of the n$^-$-type base layer 13, is provided with the protruding configuration.

Therefore, the on-resistance of the semiconductor device 1 is reduced.

In the semiconductor device 1, the conductor layers 22 and 25 provided on the two sides of the conductor layer 28 which is the trench gate electrode are connected to the emitter electrode 81. Therefore, the potential of the conductor layer 28 is shielded by the conductor layer 22 and the conductor layer 25 provided on the two sides of the conductor layer 28 when switching. In other words, the conductor layer 28 of the semiconductor device 1 is not easily affected by the potential fluctuations of the p-type diffusion layer 15 of the sub-cell 91; and the gate mirror capacitance of the semiconductor device 1 is greatly reduced. For example, in the case where the conductor layer 28 is driven in the range of 0 to 15 V, undershooting in which the potential of the conductor layer 28 is lower than 0 V is suppressed. Thereby, higher switching operations are possible in the semiconductor device 1.

On the other hand, when a potential lower than the threshold value is applied to the conductor layer 28 of the semiconductor device 1, the channel vanishes from the p-type base layer 16; and the MOSFET formed in the main cell 90 is switched to the off-state. Thereby, the voltage between the collector electrode 80 and the emitter electrode 81 increases; and a positive potential is conducted from the collector electrode 80 through the p-type collector layer 11, the n-type buffer layer 12, and the n$^-$-type base layer 13 into the n-type barrier layer 14. On the other hand, the p-type diffusion layer 15 has a potential relatively lower than the voltage of the collector electrode 80 because the p-type diffusion layer 15 is coupled to the conductor layers 22 and 25 via the insulating films 21 and 24. As a result, a positive potential is applied to the n$^-$-type base layer 13 and the n-type barrier layer 14; and a negative potential is applied to the p-type diffusion layer 15.

In the semiconductor device 1, super junctions are formed by the n-type barrier layer 14 and the p-type diffusion layer 15 proximal to the tips of the trenches 20 and 23. Accordingly, a depletion layer enlarges inside the main cell 90 from the pn junction interfaces proximal to the trenches 20 and 23. As a result, the avalanche breakdown of the junction interface between the p-type base layer 16 and the n-type barrier layer 14 is suppressed. Also, the electric field strength proximal to the tips of the trenches 20, 23, and 26 is mitigated by the enlargement of the depletion layer; and the avalanche breakdown that may occur proximally to the trench tips also is suppressed. Because the super junctions are formed, the impurity concentration of the n-type barrier layer 14 can be increased; and a saturation voltage Vce (sat) between the collector electrode 80 and the emitter electrode 81 can be reduced.

Although the pitch of the trenches 20 and 23 of the sub-cell 91 is greater than the pitches of the trenches 20, 23, and 26 of the main cell 90, the p-type diffusion layer 15 is formed to be deeper than the trenches 20, 23, and 26. Therefore, the electric field concentration of the trench tips is mitigated. Thereby, the decrease of the breakdown voltage proximal to the trench tips is suppressed.

Figure 4:
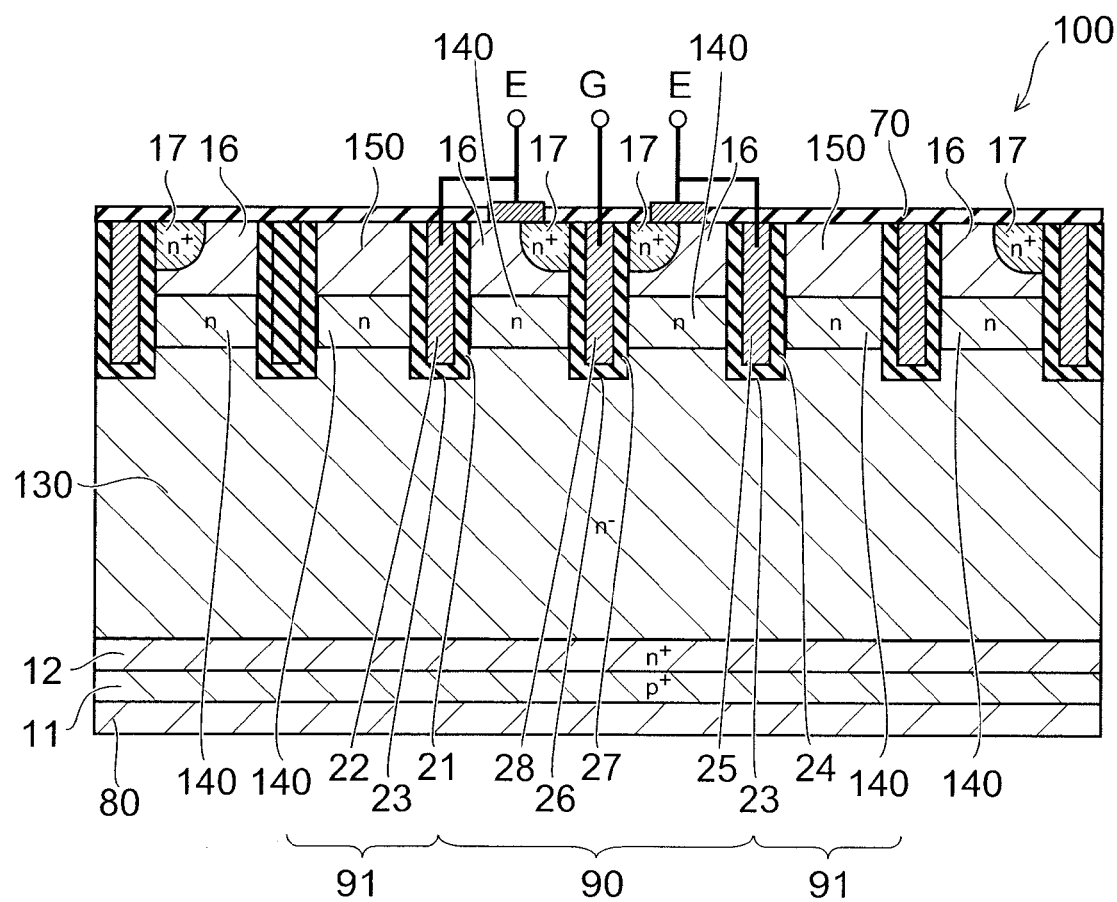
FIG. 4 illustrates operational effects of a semiconductor device 100 according to a comparative example.

Conversely, FIG. 4 illustrates operational effects of a semiconductor device 100 according to a comparative example. In the main cell 90 of the semiconductor device 100 according to the comparative example, an n-type barrier layer 140 which has an impurity concentration higher than that of an n$^-$-type base layer 130 is provided. However, the bottom faces of the n-type barrier layer 140 and a p-type diffusion layer 150 are at positions higher than the lower ends of the trenches 20, 23, and 26. Therefore, the semiconductor device 100 has a configuration in which super junctions do not exist proximally to the tips of the trenches 20 and 23.

In the configuration of the semiconductor device 100, a breakdown voltage about as high as the case where the n-type barrier layer 140 does not exist is obtained because the tips of the trenches 20, 23, and 26 are made inside the n$^-$-type base layer 130. However, as the implantation dose of the n-type barrier layer 140 is increased further to improve the characteristics (e.g., to improve the barrier properties of the n-type barrier layer 140), the n-type impurities diffuse; and the bottom face of the n-type barrier layer 140 becomes positioned on the collector electrode 80 side of the lower ends of the trenches 20, 23, and 26 at some location. At such a time, avalanche breakdown proximal to the trench tips occurs more easily in the semiconductor device 100 than in the semiconductor device 1 because the impurity concentration proximal to the tips of the trenches 20, 23, and 26 is high. In particular, the impurity concentration of the n-type barrier layer 140 cannot be higher than the impurity concentration of the n-type barrier layer 14 because the n-type barrier layer 140 and the p-type diffusion layer 150 of the semiconductor device 100 do not form a super junction. Thus, in the semiconductor device 100, an upper limit undesirably occurs on the impurity concentration of the n-type barrier layer 140 to suppress the avalanche breakdown of the pn junction interface between the n-type barrier layer 140 and the p-type base layer 16. Thereby, the saturation voltage Vce (sat) of the semiconductor device 100 is undesirably higher than the saturation voltage Vce (sat) of the semiconductor device 1.

Figure 5:
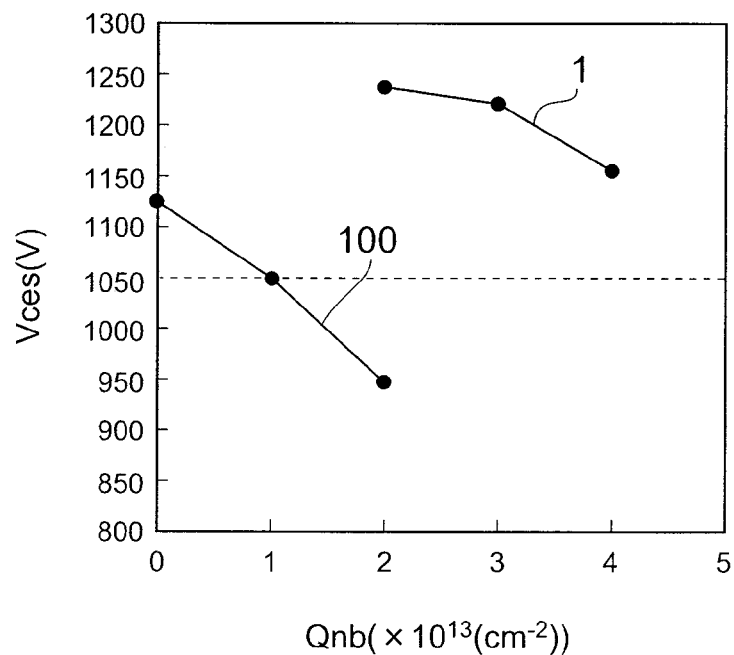
FIG. 5 illustrates the relationship between the concentration of an n-type barrier layer and the breakdown voltage (Vces)

FIG. 5 illustrates the relationship between the concentration of the n-type barrier layer and the breakdown voltage (Vces). The impurity concentrations (Qnb×$10^{13}$ cm$^{-2}$) of the n-type barrier layers 14 and 140 are illustrated on the horizontal axis; and the breakdown voltage Vces (V) is illustrated on the vertical axis.

For example, in the case where the target breakdown voltage Vces (V) is 1050 V, the breakdown voltage Vces (V) of the semiconductor device 100 drops below the target value (1050 V) when the impurity concentration of the n-type barrier layer 140 is 1.0×$10^{13}$ cm$^{-2}$ or more. Conversely, the breakdown voltage Vces (V) of the semiconductor device 1 is higher than the target value (1050 V) when the impurity concentration of the n-type barrier layer 14 is 2.0×$10^{13}$ cm$^{-2}$ to 4.0×$10^{13}$ cm$^{-2}$. Thus, the breakdown voltage of the semiconductor device 1 is higher than the breakdown voltage of the semiconductor device 100.

Another embodiment will now be described. In the description hereinbelow, similar members are marked with like reference numerals; and descriptions are omitted as appropriate for the members already described.

Second Embodiment

Figure 6:
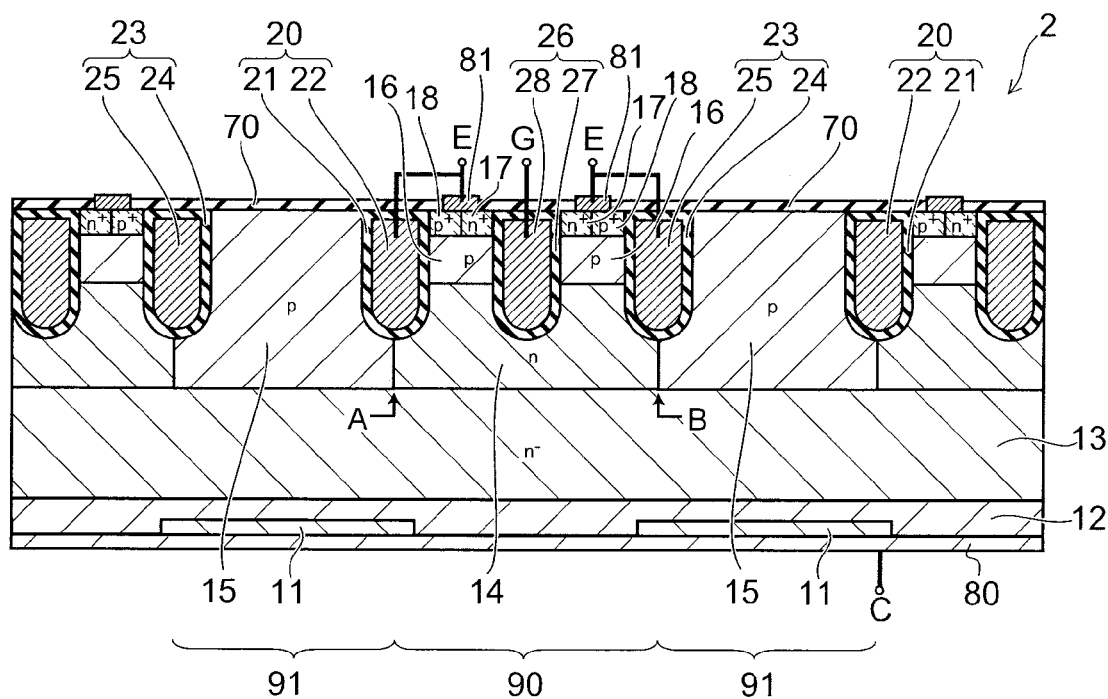
FIG. 6 is a schematic cross-sectional view of main components of a semiconductor device according to a second embodiment.

FIG. 6 is a schematic cross-sectional view of main components of a semiconductor device according to a second embodiment.

The semiconductor device 2 illustrated in FIG. 6 is a reverse conducting power semiconductor device (e.g., an RC (Reverse Conducting)-IEGT). In the semiconductor device 2, the p-type collector layer 11 is selectively provided on the collector electrode 80. For example, in the main cell 90, the p-type collector layer 11 is not provided on the collector electrode 80; and the n-type buffer layer 12 is connected directly to the collector electrode 80. In other words, one portion of the p-type collector layer 11 is removed; and the collector electrode 80 which is the first main electrode has a portion electrically connected to the n$^-$-type base layer 13 without the p-type collector layer 11 being interposed.

The MOSFET of the main cell 90 of the semiconductor device 2 has effects similar to those of the semiconductor device 1. However, in the semiconductor device 2, a current can be provided from the emitter electrode 81 through the p-type base layer 16, the n-type barrier layer 14, the n$^-$-type base layer 13, the n-type buffer layer 12, and the collector electrode 80 even in the case where the potential of the collector electrode 80 is, for example, the grounding potential and a potential higher than the grounding potential is applied to the emitter electrode 81 (a forward bias) because one portion of the n-type buffer layer 12 is connected to the collector electrode 80.

In other words, other than the MOSFET, a diode may be built into the main cell 90 of the semiconductor device 2. For example, in the main cell 90, the n-type buffer layer 12 and the n$^-$-type base layer 13 are provided on the collector electrode 80; the n-type barrier layer 14 is provided on the n$^-$-type base layer 13; and the p-type base layer 16 is provided on the n-type barrier layer 14. The emitter electrode 81 is connected to the p-type base layer 16 via the p$^+$-type contact layer 18 or the n$^+$-type emitter layer 17. In other words, a pn diode is formed between the anode and the cathode, where the emitter electrode 81 is the anode and the collector electrode 80 is the cathode.

In the semiconductor device 2, the bottom faces of the p-type diffusion layer 15 and the n-type barrier layer 14 are positioned on the collector electrode 80 side of the lower ends of the trenches 20, 23, and 26. The n-type barrier layer 14 and the p-type diffusion layer 15 form super junctions proximally to the tips of the trenches 20 and 23.

The surface area of the built-in diode can be reduced by the width of the main cell 90 being less than the width of the sub-cell 91. Further, the impurity concentration of the n-type barrier layer 14 can be as high as that of the semiconductor device 1. Therefore, the barrier properties with respect to the holes injected from the anode side are improved. Accordingly, the hole implantation from the anode side can be suppressed further in the built-in diode of the semiconductor device 2.

Methods to further suppress the hole implantation from the anode side include methods that implant He or H$^+$ into the n$^-$-type base layer 13 under the p-type base layer 16. In the case where He or H$^+$ is implanted into the n$^-$-type base layer 13, the holes in the n$^-$-type base layer 13 have shorter lives; and the hole implantation into the built-in diode is suppressed. However, such methods are problematic because the leak current during the reverse bias application increases at high temperatures and costs are high.

In the semiconductor device 2, the implantation process of He or H$^+$ can be omitted; and a low-cost and highly-durable built-in diode is formed. The reverse recovery current is lower in the built-in diode even when switching from the forward bias to the reverse bias because the hole implantation from the anode side is suppressed by the n-type barrier layer 14; and the response of the diode improves.

Third Embodiment

Figure 7:
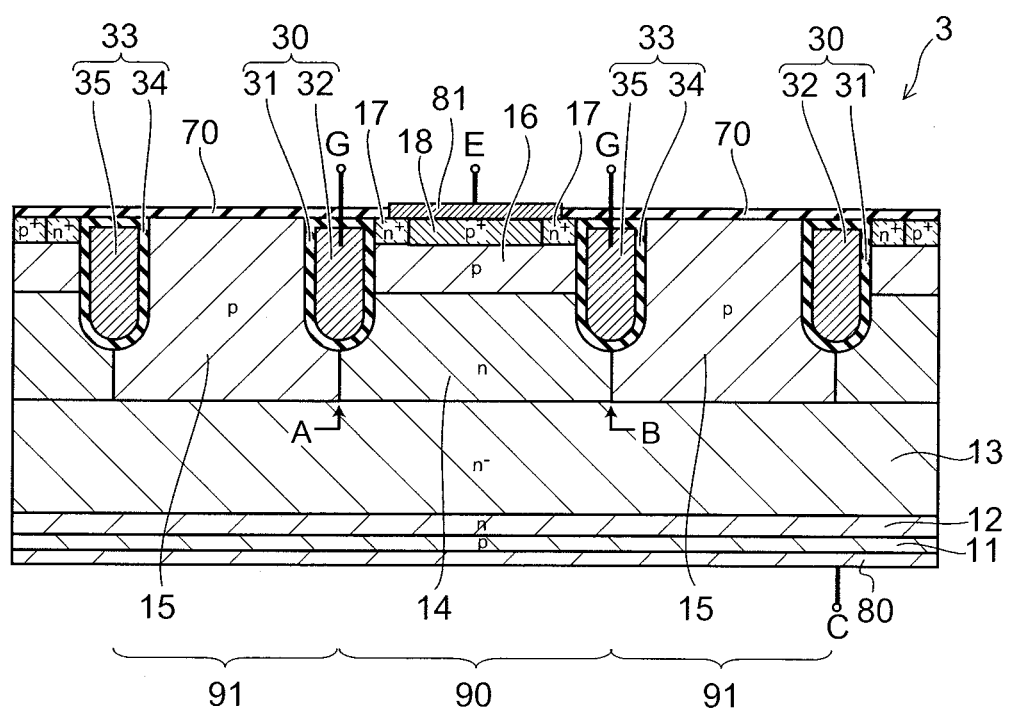
FIG. 7 is a schematic cross-sectional view of main components of a semiconductor device according to a third embodiment.

FIG. 7 is a schematic cross-sectional view of main components of a semiconductor device according to a third embodiment.

Figure 8:
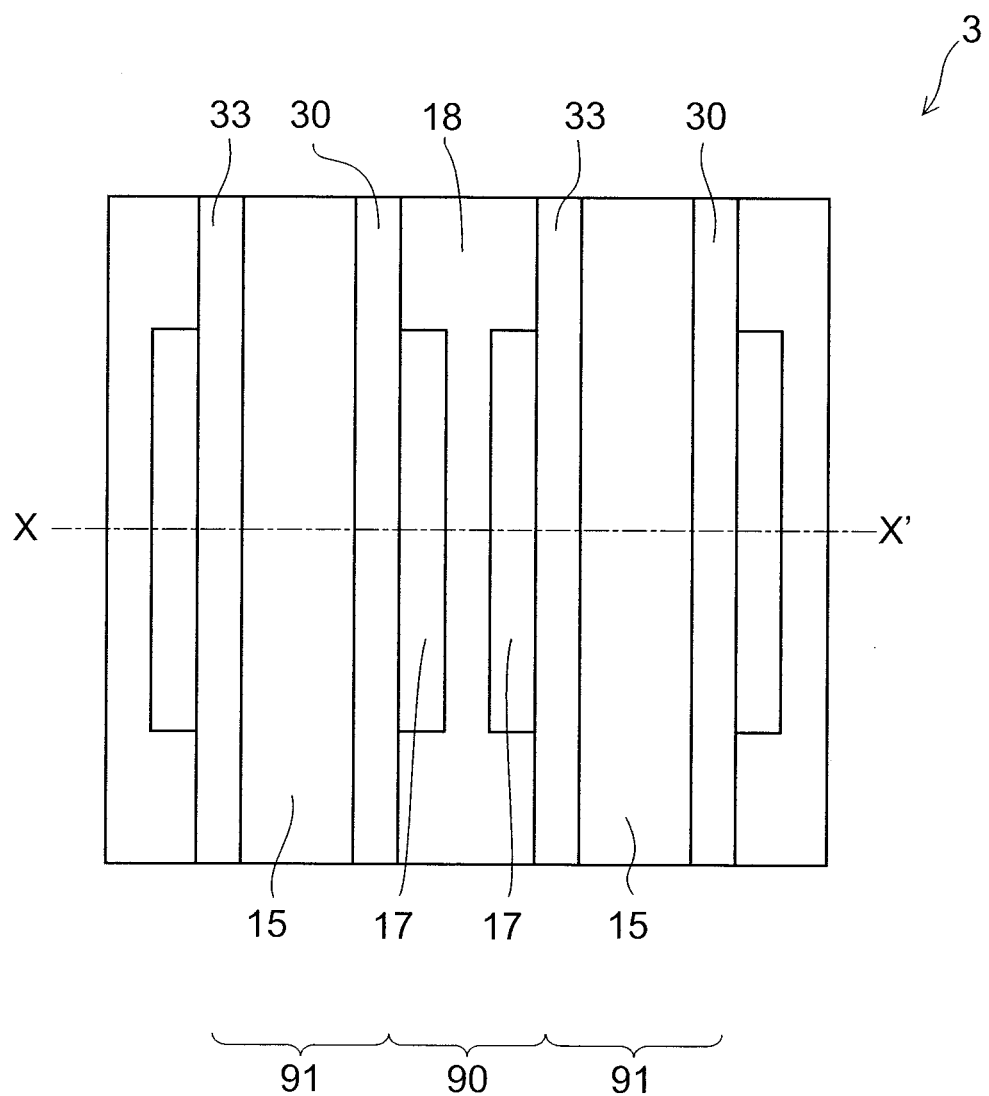
FIG. 8 is a schematic plan view of the main components of the semiconductor device according to the third embodiment.

FIG. 8 is a schematic plan view of the main components of the semiconductor device according to the third embodiment.

FIG. 7 illustrates a cross section along X-X' of FIG. 8. The emitter electrode 81 and the insulating layer 70 illustrated in FIG. 7 are not illustrated in FIG. 8.

The semiconductor device 3 illustrated in FIG. 7 is a power semiconductor device (e.g., an IGBT (Insulated Gate Bipolar Transistor)) and includes the collector electrode 80 which is the first main electrode, the p-type collector layer 11, the n$^-$-type base layer 13, the n-type barrier layer 14, the p-type diffusion layer 15, the p-type base layer 16, the n$^+$-type emitter layer 17, the trenches 20, 23, and 26, and the emitter electrode 81 which is the second main electrode. Herein, "collectors" may be referred to as "drains;" and "emitters" may be referred to as "sources." The n-type impurity conductivity type is taken as the first conductivity type; and the p-type is taken as the second conductivity type.

In the semiconductor device 3 as illustrated in FIG. 7, the p-type collector layer 11 is provided on the collector electrode 80 (the first main electrode). The n-type buffer layer 12 is provided on the p-type collector layer 11. The $n^-$-type base layer 13 is provided on the n-type buffer layer 12. The impurity concentration of the $n^-$-type base layer 13 is lower than the impurity concentration of the n-type buffer layer 12. The $n^-$-type base layer 13 functions as a drift layer.

The n-type barrier layer 14 and the p-type diffusion layer 15 are provided on the $n^-$-type base layer 13. The n-type barrier layer 14 and the p-type diffusion layer 15 are alternately arranged on the $n^-$-type base layer 13. The impurity concentration of the n-type barrier layer 14 is higher than the impurity concentration of the $n^-$-type base layer 13. The upper face of the n-type barrier layer 14 is lower than the upper face of the p-type diffusion layer 15. Restated, the n-type barrier layer 14 is formed with a protruding configuration from the major surface of the $n^-$-type base layer 13 toward the p-type diffusion layer 15 side. The p-type base layer 16 is provided on the n-type barrier layer 14. The $n^+$-type emitter layer 17 and the $p^+$-type contact layer 18 are selectively provided in the surface of the p-type base layer 16. Multiple trenches are made with trench configurations from the surfaces of the p-type base layer 16 and the p-type diffusion layer 15 toward the collector electrode 80 side. The trenches are provided between the p-type base layer 16 and the p-type diffusion layer 15 and between the n-type barrier layer 14 and the p-type diffusion layer 15.

For example, the n-type barrier layer 14 is interposed in the p-type diffusion layer 15. Thereby, two pn junction interfaces exist on two sides of the n-type barrier layer 14. One of the two pn junction interfaces is indicated by arrow A in the drawings; and the pn junction interface on the side opposite to arrow A is indicated by arrow B.

A trench 30 is made with a trench configuration from the surfaces of the p-type base layer 16 and the $n^+$-type emitter layer 17 toward the collector electrode 80 side at the junction interface between the n-type barrier layer 14 and the p-type diffusion layer 15 indicated by arrow A. A conductor layer 32 made of, for example, polysilicon is provided inside the trench 30 with an insulating film 31 such as an oxide film interposed. The bottom faces (the lower faces) of the p-type diffusion layer 15 and the n-type barrier layer 14 are positioned on the collector electrode 80 side of the lower end of the trench 30. The n-type barrier layer 14 and the p-type diffusion layer 15 form a super junction proximally to the tip (proximally to the lower end) of the trench 30.

A trench 33 is made with a trench configuration from the surfaces of the p-type base layer 16 and the $n^+$-type emitter layer 17 toward the collector electrode 80 side at the junction interface between the n-type barrier layer 14 and the p-type diffusion layer 15 indicated by arrow B. A conductor layer 35 made of, for example, polysilicon is provided inside the trench 33 with an insulating film 34 such as an oxide film interposed. The bottom faces of the p-type diffusion layer 15 and the n-type barrier layer 14 are positioned on the collector electrode 80 side of the lower end of the trench 23. The n-type barrier layer 14 and the p-type diffusion layer 15 form a super junction proximally to the tip of the trench 33. The trench 30 and the trench 33 have substantially the same depth.

Thus, in the semiconductor device 3, the bottom faces of the p-type diffusion layer 15 and the n-type barrier layer 14 are positioned on the collector electrode 80 side of the lower ends of the trenches 30 and 33. The conductor layers 32 and 35 are trench gate electrodes of the semiconductor device 3 and are electrically connected to gate interconnects (not illustrated). The conductor layers 32 and 35 are control electrodes configured to control the current flow between the $n^+$-type emitter layer 17 and the n-type barrier layer 14.

The $p^+$-type contact layer 18 and the $n^+$-type emitter layer 17 are electrically connected to the emitter electrode 81 (the second main electrode). The insulating layer 70 is provided on the surfaces of the p-type diffusion layer 15, the p-type base layer 16, the $n^+$-type emitter layer 17, and the trenches 30 and 33.

In the semiconductor device 3 as illustrated in FIG. 8, the trenches 30 and 33 extend in substantially parallel stripe configurations. The extension direction is, for example, a direction substantially parallel to the major surface of the $n^-$-type base layer 13. The $p^+$-type contact layer 18 is provided adjacent to the $n^+$-type emitter layer 17. The $n^+$-type emitter layer 17 contacts the side face of the trench 30 or the side face of the trench 33.

Referring to FIG. 7 and FIG. 8, the p-type base layer 16 contacts the side face of the trench 30 or the side face of the trench 33 under the $n^+$-type emitter layer 17. The p-type base layer 16 is provided under the $n^+$-type emitter layer 17 and the $p^+$-type contact layer 18. The p-type base layer 16 is electrically connected to the emitter electrode 81 with the $n^+$-type emitter layer 17 or the $p^+$-type contact layer 18 interposed.

The main cell 90 and the sub-cell 91 extend in the direction in which the trenches 30 and 33 extend and are disposed alternately, where the main cell 90 is taken to be the region occupied by the n-type barrier layer 14 and the p-type base layer 16 on the collector electrode 80 and the sub-cell 91 is taken to be the region occupied by the p-type diffusion layer 15 on the collector electrode 80. The main cell 90 includes the conductor layers 32 and 35 which are gate electrodes, the p-type base layer 16, the $n^+$-type emitter layer 17, and the n-type barrier layer 14 to function as a MOSFET (Metal Oxide Semiconductor Field Effect Transistor). Therefore, the impurity concentrations and the surface areas of the p-type base layer 16 and the $n^+$-type emitter layer 17 of the main cell 90 are determined according to the necessary performance of the MOSFET. On the other hand, the impurity concentration of the n-type barrier layer 14 may be a concentration higher than the impurity concentration of the $n^-$-type base layer 13. However, the impurity concentration is adjusted such that the depletion layer expands sufficiently from the pn junction interface between the n-type barrier layer 14 and the p-type diffusion layer 15.

The materials of the p-type collector layer 11, the n-type buffer layer 12, the $n^-$-type base layer 13, the n-type barrier layer 14, the p-type diffusion layer 15, the p-type base layer 16, the $n^+$-type emitter layer 17, and the $p^+$-type contact layer 18 have, for example, silicon (Si) as the main component. The materials of the collector electrode 80 and the emitter electrode 81 are metals. The materials of the insulating films 31 and 34 are, for example, silicon oxide ($SiO_2$).

Operational effects of the semiconductor device 3 will now be described.

Figure 9:
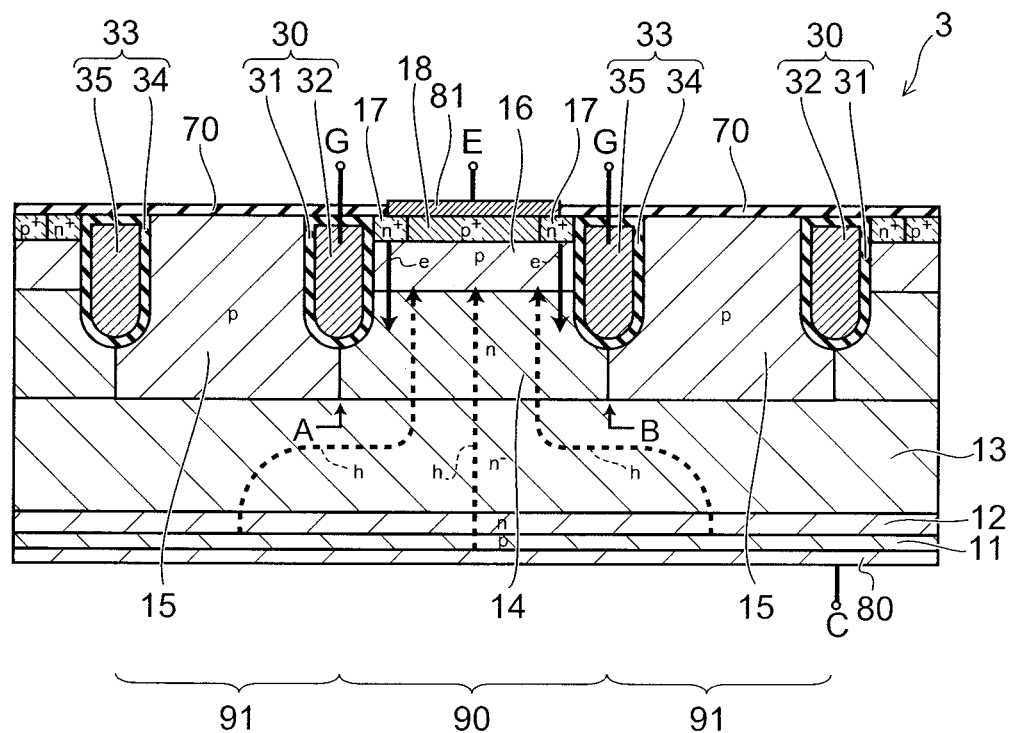
FIG. 9 illustrates operational effects of the semiconductor device 3.

FIG. 9 illustrates the operational effects of the semiconductor device 3.

A potential not less than the threshold value is applied to the conductor layers 32 and 35 of semiconductor device 3 illustrated in FIG. 9 in a state in which the potential of the emitter electrode 81 is, for example, the grounding potential and a potential higher than the grounding potential is applied to the collector electrode 80. Then, a channel is formed in the region contacting the insulating films 31 and 34 of the p-type base layer 16. Thereby, the MOSFET formed in the main cell 90 is switched to the on-state; and electrons flow from the $n^+$-type emitter layer 17 through the channel into the n-type barrier layer 14 (referring to arrow e (the electrons) of the drawing). At this time, holes flow from the p-type collector layer 11 through the n-type buffer layer 12 into the $n^-$-type base layer 13 (referring to arrow h (the holes)). As a result, a current flows between the collector electrode 80 and the emitter electrode 81.

In the main cell 90 of the semiconductor device 3, the path of the electrons flowing through the n-type semiconductor layer increases because the n-type barrier layer 14, which has an impurity concentration higher than that of the $n^-$-type base layer 13, is provided with a protruding configuration. Therefore, the on-resistance of the semiconductor device 3 is reduced.

On the other hand, the channel vanishes from the p-type base layer 16 and the MOSFET formed in the main cell 90 is switched to the off-state when a potential lower than the threshold value is applied to the conductor layers 32 and 35 of the semiconductor device 3. Thereby, the voltage between the collector electrode 80 and the emitter electrode 81 increases; and a positive potential is conducted from the collector electrode 80 through the p-type collector layer 11, the n-type buffer layer 12, and the $n^-$-type base layer 13 into the n-type barrier layer 14. On the other hand, the p-type diffusion layer 15 has a potential relatively lower than the voltage of the collector electrode 80 because the p-type diffusion layer 15 is coupled to the conductor layers 32 and 35 via the insulating films 31 and 34. As a result, a positive potential is applied to the $n^-$-type base layer 13 and the n-type barrier layer 14; and a negative potential is applied to the p-type diffusion layer 15.

In the semiconductor device 3, the n-type barrier layer 14 and the p-type diffusion layer 15 form super junctions proximally to the tips of the trenches 30 and 33. Accordingly, depletion layers enlarge inside the main cell 90 from the pn junction interfaces proximal to the tips of the trenches 30 and 33. As a result, the avalanche breakdown of the junction interface between the p-type base layer 16 and the n-type barrier layer 14 is suppressed. Also, the electric field strength proximal to the tips of the trenches 30 and 33 is mitigated by the enlargement of the depletion layers; and the avalanche breakdown that may occur proximally to the trench tips also is suppressed. Because the super junctions are formed, the impurity concentration of the n-type barrier layer 14 can be increased; and the saturation voltage Vce (sat) between the collector electrode 80 and the emitter electrode 81 can be reduced.

Fourth Embodiment

Figure 10:
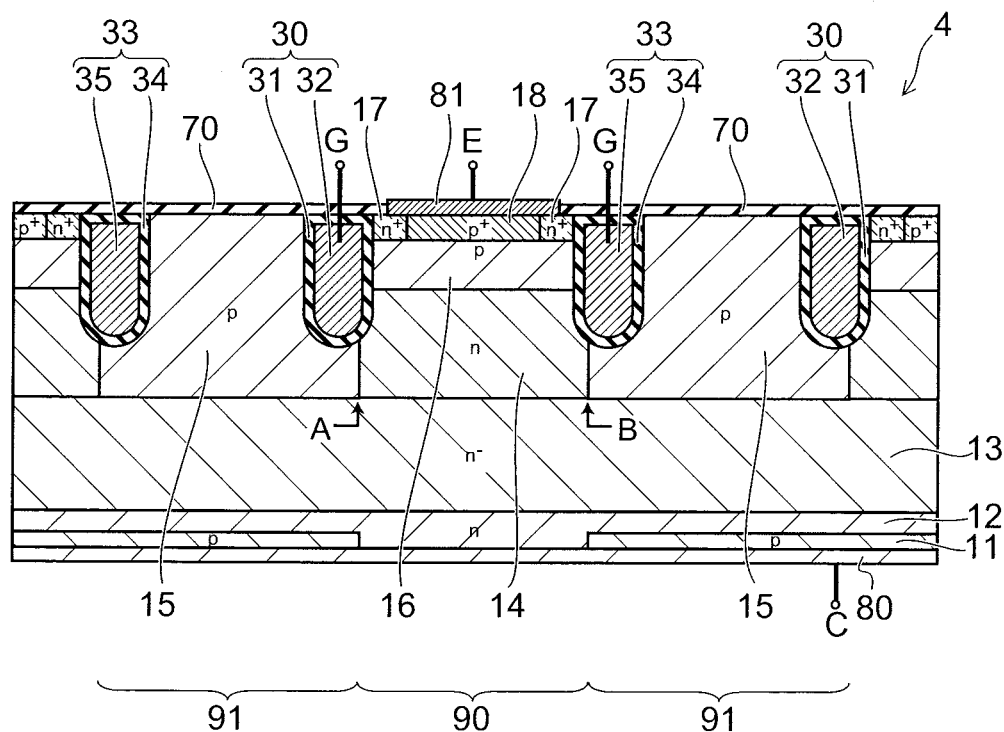
FIG. 10 is a schematic cross-sectional view of main components of a semiconductor device according to a fourth embodiment.

FIG. 10 is a schematic cross-sectional view of main components of a semiconductor device according to a fourth embodiment.

The semiconductor device 4 illustrated in FIG. 10 is a reverse conducting power semiconductor device (e.g., an RC (Reverse Conducting)-IGBT). In the semiconductor device 4, the p-type collector layer 11 is selectively provided on the collector electrode 80. For example, in the main cell 90, the p-type collector layer 11 is not provided on the collector electrode 80; and the n-type buffer layer 12 is connected directly to the collector electrode 80. In other words, one portion of the p-type collector layer 11 is removed; and the collector electrode 80 which is the first main electrode has a portion electrically connected to the $n^-$-type base layer 13 without the p-type collector layer 11 being interposed.

The MOSFET of the main cell 90 of the semiconductor device 4 has effects similar to those of the semiconductor device 3. However, in the semiconductor device 4, a current can be provided from the emitter electrode 81 through the p-type base layer 16, the n-type barrier layer 14, the $n^-$-type base layer 13, the n-type buffer layer 12, and the collector electrode 80 even in the case where the potential of the collector electrode 80 is, for example, the grounding potential and a potential higher than the grounding potential is applied to the emitter electrode 81 (a forward bias) because one portion of the n-type buffer layer 12 is connected to the collector electrode 80.

In other words, other than the MOSFET, a diode may be built into the main cell 90 of the semiconductor device 4. For example, in the main cell 90, the n-type buffer layer 12 and the $n^-$-type base layer 13 are provided on the collector electrode 80; the n-type barrier layer 14 is provided on the $n^-$-type base layer 13; and the p-type base layer 16 is provided on the n-type barrier layer 14. The emitter electrode 81 is connected to the p-type base layer 16 via the $p^+$-type contact layer 18 or the $n^+$-type emitter layer 17. In other words, a pn diode is formed between the anode and the cathode, where the emitter electrode 81 is the anode and the collector electrode 80 is the cathode.

In the semiconductor device 4, the bottom faces of the p-type diffusion layer 15 and the n-type barrier layer 14 are positioned on the collector electrode 80 side of the lower ends of the trenches 30 and 33. The n-type barrier layer 14 and the p-type diffusion layer 15 form super junctions proximally to the tips of the trenches 30 and 33.

The surface area of the built-in diode can be reduced by providing the trenches 30 and 33 on two sides of the main cell 90. The impurity concentration of the n-type barrier layer 14 can be as high as that of the semiconductor device 3. Therefore, the barrier properties with respect to the holes injected from the anode side are improved. Accordingly, the hole implantation from the anode side can be suppressed further in the built-in diode of the semiconductor device 4.

Methods to further suppress the hole implantation from the anode side include methods that implant He or $H^+$ into the $n^-$-type base layer 13 under the p-type base layer 16. In the case where He or $H^+$ is implanted into the $n^-$-type base layer 13, the holes in the $n^-$-type base layer 13 have shorter lives; and the hole implantation into the built-in diode is suppressed. However, such methods are problematic because the leak current during the reverse bias application increases at high temperatures and costs are high.

In the semiconductor device 4, the implantation process of He or $H^+$ can be omitted; and a low-cost and highly-durable built-in diode is formed. The reverse recovery current is lower in the built-in diode even when switching from the forward bias to the reverse bias because the hole implantation from the anode side is suppressed by the n-type barrier layer 14; and the response of the diode improves.

Fifth Embodiment

Modifications in which the trenches of the structures of FIG. 1 and FIG. 7 are shallower will now be described.

Figure 11:
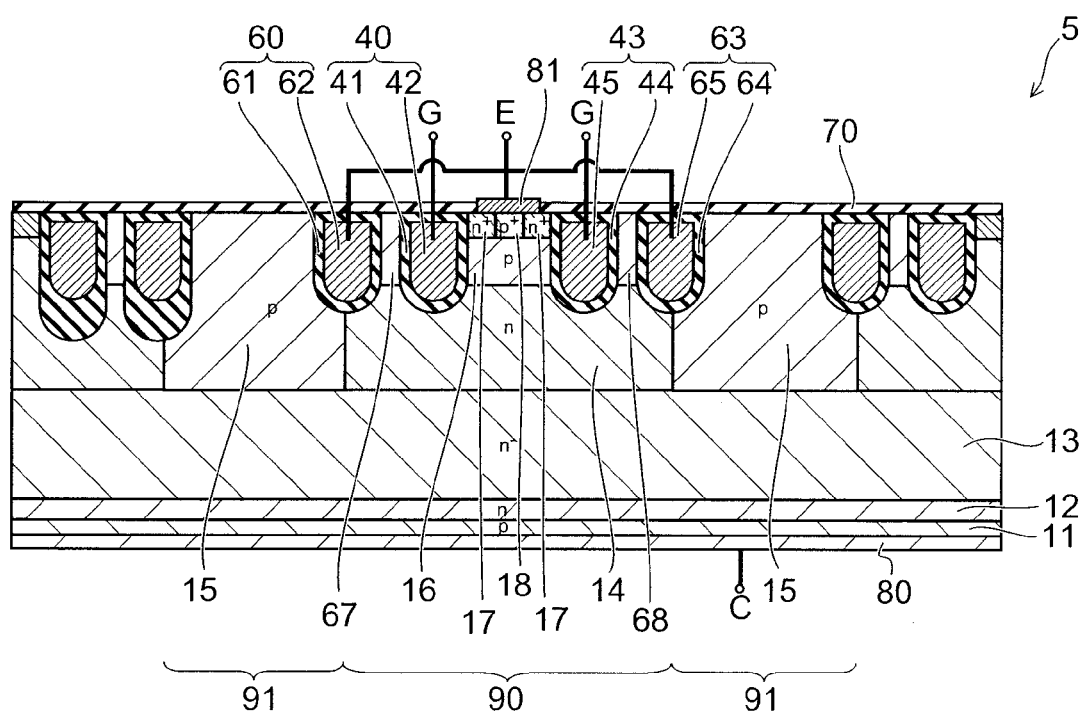
FIG. 11 is a schematic cross-sectional view of main components of a semiconductor device according to a fifth embodiment.

FIG. 11 is a schematic cross-sectional view of main components of a semiconductor device according to a fifth embodiment.

In the semiconductor device 5 illustrated in FIG. 11, trenches 40, 43, 60, and 63 are shallower than the trenches 20, 23, and 26 of the semiconductor device 1 and the trenches 30 and 33 of the semiconductor device 3. A conductor layer 42 is formed inside the trench 40 with an insulating film 41 interposed. A conductor layer 45 is formed inside the trench 43 with an insulating film 44 interposed. A conductor layer 62 is formed inside the trench 60 with an insulating film 61 interposed. A conductor layer 65 is formed inside the trench 63 with an insulating film 64 interposed. The p-type base layer 16 is positioned between the trenches 40 and 43; and the $n^+$-type emitter layer 17 contacts each of the trenches 40 and 43. The conductor layers 62 and 65 are connected to the emitter electrode 81.

For example, in the case where the trenches 20, 23, and 26 of the semiconductor device 1 illustrated in FIG. 1 are shallow, the apparent distance between the p-type diffusion layer 15 and the p-type base layer 16 shortens.

Then, a parasitic pnpn thyristor including the p-type base layer 16, the n-type barrier layer 14, the p-type diffusion layer 15, and the $n^-$-type base layer 13 operates easily; and there are cases where turn-off during operations at high current densities cannot be controlled and element breakdown occurs.

However, in the semiconductor device 5, the distance from the p-type base layer 16 to the super junction of the n-type barrier layer 14 and the p-type diffusion layer 15 is lengthened by interposing the trenches 40 and 43 to avoid such a phenomenon; and the parasitic pnpn thyristor does not operate easily. Thereby, in the semiconductor device 5, element breakdown due to turn-off defects can be avoided.

For the semiconductor device 3 illustrated in FIG. 7, the potential of the conductor layers 42 and 45 which are gate electrodes is shielded from the p-type diffusion layer 15 by the conductor layers 62 and 65 which are emitter shield electrodes. Accordingly, the conductor layers 42 and 45 which are the gate electrodes are not easily affected by the potential fluctuations of the p-type diffusion layer 15.

Here, the emitter-collector resistance can be reduced by p-type semiconductor layers 67 and 68 between the trench 40 and the trench 60 and between the trench 43 and the trench 63 having floating potentials. However, there is a risk of the gate capacitance (the gate-drain capacitance) increasing due to the potential fluctuation of the p-type semiconductor layers 67 and 68 which have floating potentials when switching. However, in the semiconductor device 5, the volumes of the p-type semiconductor layers 67 and 68 are smaller than that of the p-type diffusion layer 15. Accordingly, the gate capacitance can be reduced.

In the case where the p-type semiconductor layers 67 and 68 are connected to the emitter electrode 81 via a resistance element, the potential fluctuation of the p-type semiconductor layers 67 and 68 is suppressed and the gate capacitance is reduced. The emitter-collector resistance can be reduced further by reducing the volumes of the p-type semiconductor layers 67 and 68.

The resistance recited above that connects the p-type semiconductor layers 67 and 68 to the emitter electrode 81 may be formed of polysilicon and may connect a portion of the p-type semiconductor layers 67 and 68 to the emitter electrode 81.

Sixth Embodiment

Figure 12:
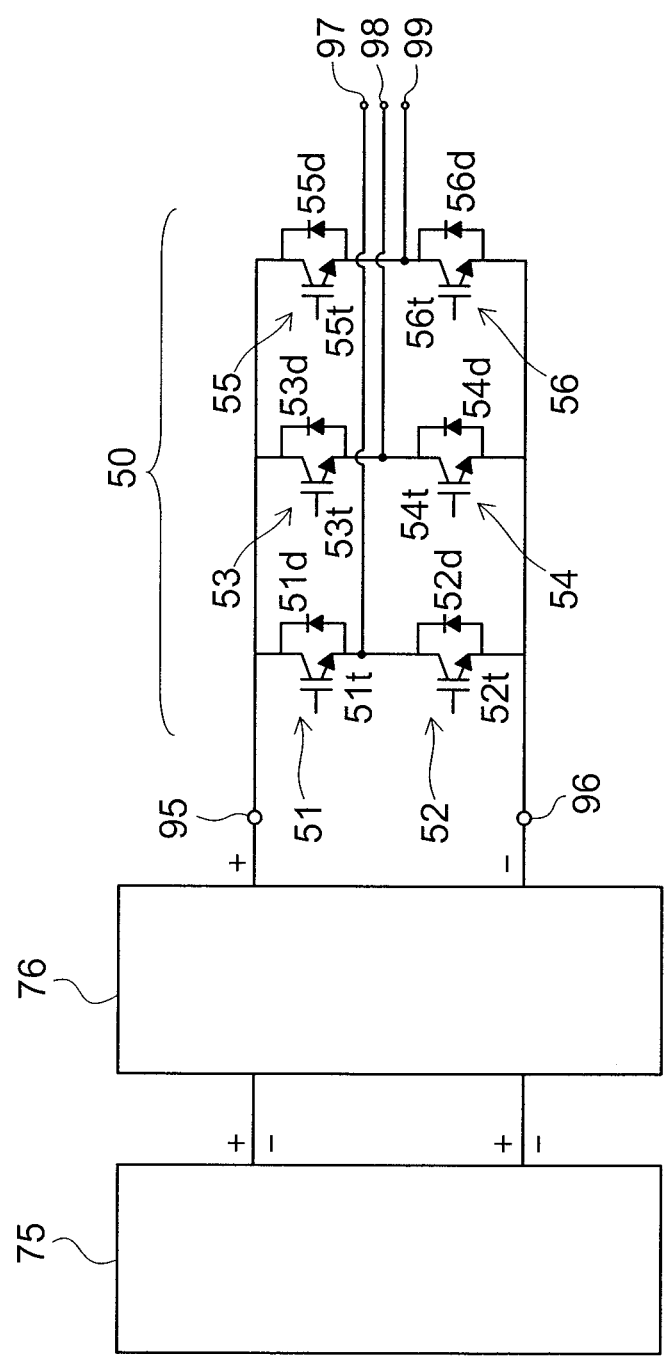
FIG. 12 illustrates the main components of an alternating current-direct current conversion circuit including an inverter circuit.

FIG. 12 illustrates main components of an alternating current-direct current conversion circuit including an inverter circuit.

For example, as illustrated in FIG. 12, an alternating voltage supplied from an alternating-current power source 75 is converted to a direct voltage by a converter 76. A positive voltage is output from an output terminal 95 of the converter 76; and a negative voltage is output from an output terminal 96. The output terminals 95 and 96 are connected to an inverter 50.

The inverter 50 is a three-phase inverter circuit having a so-called 6-in-1 structure (a structure in which six elements 51 to 56 are inside one circuit) and includes diodes 51d to 55d connected in anti-parallel to switching elements 51t to 56t respectively. The switching elements 51t to 56t are, for example, IGBTs; and the diodes 51d to 55d are, for example, FRDs (First Recovery Diodes).

The switching element 51t and the switching element 52t are connected in series; the switching element 53t and the switching element 54t are connected in series; and the switching element 55t and the switching element 56t are connected in series. The switching elements 51t, 53t, and 55t are connected to the output terminal 95; and the switching elements 52t, 54t, and 56t are connected to the output terminal 96. The intermediate point between the switching element 51t and the switching element 52t is connected to an output terminal 97; the intermediate point between the switching element 53t and the switching element 54t is connected to an output terminal 98; and the intermediate point between the switching element 55t and the switching element 56t is connected to an output terminal 99. A three-phase alternating voltage is obtained from the output terminals 97, 98, and 99.

By using the semiconductor device 2 described above, an inverter that uses individual IGBTs and FRDs (First Recovery Diodes) can be condensed into one semiconductor device 2. Thereby, the circuit surface area and the cost are reduced. In particular, the response of the built-in diode improves in the case where the semiconductor device 2 is used. Accordingly, an inverter 50 having a good response is formed. Similar effects are obtained by replacing the semiconductor device 2 with the semiconductor device 4.

Hereinabove, exemplary embodiments of the invention are described with reference to specific examples. However, the invention is not limited to these specific examples. In other words, appropriate design modifications made to these specific examples by one skilled in the art also are within the scope of the invention to the extent that the features of the invention are included. For example, the components and the dispositions, materials, conditions, configurations, sizes, etc., thereof included in the specific examples described above are not limited to those illustrated and may be modified appropriately. For example, the invention is practicable also in a MOSFET in which the p-type collector layer 11 is removed.

Although the case is described in this embodiment where the first conductivity type is taken to be the n-type and the second conductivity type is taken to be the p-type, structures in which the first conductivity type is the p-type and the second conductivity type is the n-type also are included in the embodiments; and similar effects are obtained. Further, the invention is practicable with various modifications without departing from the spirit of the invention.

The components included in the embodiments described above can be used in combinations within the extent of technical feasibility; and such combinations also are included in the scope of the invention to the extent that the features of the invention are included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a first base layer of a first conductivity type;
a first semiconductor layer of the first conductivity type abutting the first base layer in a first direction, an impurity concentration of the first semiconductor layer being higher than an impurity concentration of the first base layer;
a second semiconductor layer of a second conductivity type abutting the first base layer in the first direction, the second semiconductor layer being adjacent to and in direct contact with the first semiconductor layer in a second direction perpendicular to the first direction;
a second base layer of the second conductivity type provided on the first semiconductor layer such that the first semiconductor layer is between the first and second base layers in the first direction;
a first conductor layer provided adjacent to the first semiconductor layer, the second semiconductor layer, and the second base layer via a first insulating film, the first conductor layer being between the second base layer and the second semiconductor layer in the second direction and a bottom portion of the first conductor layer in the first direction being between the first semiconductor layer and the second semiconductor layer;
a first electrode electrically connected to the first base layer; and
a second electrode electrically connected to the second base layer,
the first semiconductor layer directly contacting the second semiconductor layer at a position between the bottom portion and the first base layer.

2. The device according to claim 1, further comprising:
a control electrode provided in the first semiconductor layer and the second base layer via a second insulating film; and
an emitter layer of the first conductivity type being connected to the control electrode via the second insulating film, the emitter layer being selectively provided in a surface of the second base layer.

3. The device according to claim 2, wherein the first semiconductor layer and the second semiconductor layer are positioned under a lower edge of the first conductor layer.

4. The device according to claim 1, further comprising a contact layer of the second conductivity type provided between the first electrode and the first base layer in the first direction.

5. The device according to claim 4, wherein the first semiconductor layer and the second semiconductor layer are positioned under a lower edge of the first conductor layer.

6. The device according to claim 3, wherein the first semiconductor layer and the second semiconductor layer are positioned under a lower edge of the first conductor layer.

7. The device according to claim 1, wherein a junction between the first and second semiconductor layers is disposed below the first conductor layer and above the first base layer.

8. The device according to claim 7, wherein the junction extends along the first direction from the first base layer to the first insulating film.

9. A semiconductor device, comprising:
a first base layer of a first conductivity type;
a first semiconductor layer of the first conductivity type above the first base layer in a first direction, an impurity concentration of the first semiconductor layer being higher than an impurity concentration of the first base layer;
a second semiconductor layer of a second conductivity type above the first base layer in the first direction and having a portion directly adjacent in a second direction to a portion of the first semiconductor layer, the second direction perpendicular to the first direction;
a second base layer of the second conductivity type provided on the first semiconductor layer such that the first semiconductor layer is between the first and second base layers in the first direction;
a first conductor layer adjacent to the first semiconductor layer, the second semiconductor layer, and the second base layer via a first insulating film, the first conductor layer being between the second base layer and the second semiconductor layer in the second direction and a portion of the first conductor layer being between the first semiconductor layer and the second semiconductor layer in the second direction;
a first electrode electrically connected to the first base layer; and
a second electrode electrically connected to the second base layer.

10. The device of claim 9, wherein the portion of first semiconductor layer and the portion of the second semiconductor layer form a pn junction at an interface disposed between, in the first direction, the first conductor layer and the first base layer.

11. The device of claim 10, wherein the interface extends along the first direction from the first base layer to the first insulating film.

* * * * *